United States Patent [19]
Inaba et al.

[11] Patent Number: 6,071,343
[45] Date of Patent: Jun. 6, 2000

[54] HEAT TREATMENT JIG AND METHOD OF PRODUCING THE SAME

[75] Inventors: Takeshi Inaba; Shuichi Takeda, both of Ogunimachi; Shigeo Kato, Kawanishi-machi; Yasumi Sasaki, Nagai; Yukio Ito; Masanori Sato, both of Ogunimachi, all of Japan

[73] Assignee: Toshiba Ceramics Co., Ltd., Tokyo, Japan

[21] Appl. No.: 08/743,791

[22] Filed: Nov. 5, 1996

[51] Int. Cl.[7] ..................................................... C04B 35/36
[52] U.S. Cl. ............................................. 118/500; 118/728
[58] Field of Search ...................... 427/248.1; 428/698, 428/336; 432/264; 117/1; 118/500, 728

*Primary Examiner*—Bruce Breneman
*Assistant Examiner*—Sylvia R. MacArthur
*Attorney, Agent, or Firm*—Foley & Lardner

[57] ABSTRACT

A heat treatment jig with a silicon carbide coating for production of a semiconductor includes a base material and a silicon carbide film formed on the surface of the base material by a CVD method. The silicon carbide film is formed from a plurality of layers substantially parallel to the surface of the base material, and at least one of the layers is formed as a nucleus formation layer while the other layers are formed as ordinary crystal layers so that crystal growth between the ordinary crystal layers across the nucleus formation layer is discontinuous while crystal growth of the silicon carbide in the ordinary crystal layers are continuous in a direction of thickness of the ordinary crystal layers.

9 Claims, 4 Drawing Sheets

A,C : ORDINARY CRYSTAL LAYER
B : NUCLEUS FORMATION LAYER

HEAT TREATMENT JIG AND METHOD OF PRODUCING THE SAME

BACKGROUND OF THE INVENTION

This invention relates to a heat treatment jig (CVD coated products) with a silicon carbide coating for production of a semiconductor which is used for a heat treatment process in production of a semiconductor such as, for example, a susceptor or a wafer boat and a method of producing the heat treatment jig.

Conventionally, CVD coated products are used as heat treatment jigs such as a susceptor or a wafer boat. A CVD coated product is produced by forming a film of silicon carbide (hereinafter referred to as CVD-SiC film) on the surface of a base material by a chemical vapor deposition method (hereinafter referred to as CVD method), that is, by providing a coating on the surface of a base material As such heat treatment jigs, the first to third prior art heat treatment jigs described below are available.

First, the first prior art heat treatment jig will be described with reference to FIG. 6.

FIG. 6 is a schematic view showing part of a section of the heat treatment jig of the first prior art taken in a direction of the thickness of a CVD-SiC film.

In the CVD-SiC film 22, crystal of silicon carbide continuously grows linearly or radially from a surface 1*a* of a base material 1 toward the surface of the CVD-SiC film 22.

Subsequently, the second prior art heat treatment jig will be described. This heat treatment jig is formed by performing coating by a plurality of times, that is, by forming a plurality of CVD-SiC films on the surface of a base material. The construction of the CVD-SiC film of the second prior art heat treatment jig is substantially similar to that of the first prior art heat treatment jig. It is to be noted that, in FIG. 6–8, a stroke of impurity dispersion which occurs from a start point provided by the base material is schematically indicated by an arrow mark 23.

FIG. 7 is a schematic view showing part of a section of the CVD-SIC film of the heat treatment jig of the second prior art taken in a direction of the thickness. In the CVD-SiC film 24, crystal of silicon carbide continuously grows in a direction of the thickness through a boundary 25 intermediately of the CVD-SiC film 24 of the second prior art heat treatment jig.

Subsequently, the third prior art heat treatment jig will be described with reference to FIG. 8. FIG. 8 is a schematic view showing part of a section of the heat treatment jig of the third prior art taken in a direction of the thickness of the CVD-SiC film.

This heat treatment jig is formed by grinding the surface of a substrate film (CVD-SiC film) in each of a plurality of times of coating and forming another CVD-SiC film 29 on the ground surface 28 in order to interrupt continuous growth of the CVD-SiC film 26 in the direction of the thickness. The method of compulsorily interrupting the crystal growth (face) in this manner is described in Japanese Patent Laid-Open Application No. Heisei 5-87991.

In the first prior art heat treatment jig, an impurity disperses from the base material into an adjacent position of the heat treatment jig through the CVD-SiC film 22.

In the first and second prior art heat treatment jigs described above, grain boundaries of polycrystal of silicon carbide are formed linearly in a direction of the thickness in the CVD-SiC film 22. The impurity which disperses from the base material 1 into an adjacent portion of the heat treatment jig through the CVD-SiC film 22 advances fastest through grain boundaries of polycrystal of silicon carbide as indicated by an arrow mark in FIG. 6. Accordingly, diffusion of an impurity takes linear strokes. In order to retard external diffusion of the impurity, the CVD-SiC film must be covered with a thick coating.

Meanwhile, in the third prior art heat treatment jig wherein the substrate film is ground in order to suppress continuous growth of crystal, although crystal growth of the substrate film 27 can be suppressed, the impurity may possibly be attracted to and remain on the ground face 28, and this may possibly give rise to a problem that the ground face 28 provides a start point for impurity dispersion. It is to be noted that, in FIG. 8, a stroke of impurity dispersion which occurs from a start point provided by the base material is schematically indicated by an arrow mark 30, and another stroke of impurity dispersion which occurs from a start point provided by the ground face itself is schematically indicated by another arrow mark 31.

Besides, while grounding of a substrate film can be performed readily where the heat treatment jig has a simple shape, for example, like a susceptor, where the heat treatment jig conversely has a complicated (not planar) shape, for example, like a boat, the grounding operation is very difficult. Further, even where the heat treatment jig has a planar shape, there is another problem that much operation time is required by a grinding step.

Furthermore, where grounding is performed, the heat treatment jig may possibly suffer from a different problem that the adhesion strength of a film to the ground face is not sufficiently high and the film may be exfoliated by a sudden thermal hysteresis.

Thus, in order to solve the problems described above, film formation processing conditions for obtaining a heat treatment jig wherein the impurity diffusion rate can be minimized and a multiple layer film which is free from a defect and is superior in adhesion have been investigated.

SUMMARY OF THE INVENTION

It is a first object of the present invention to provide a heat treatment jig wherein the impurity diffusion rate can be reduced to suppress pollution to a wafer or the like and to provide a heat treatment jig wherein adhesion of layers of a multiple layer silicon carbide film can be augmented to increase the adhesion strength of the layers.

It is a second object of the present invention to provide a method of producing a heat treatment jig by which a heat treatment jig having a complicated shape can be produced readily.

In order to attain the first object described above, the present invention provides a heat treatment jig with a silicon carbide coating for production of a semiconductor which includes a base material and a silicon carbide film formed on a surface of the base material by a CVD method, wherein the silicon carbide film is formed from a plurality of layers substantially parallel to the surface of the base material and at least one of the layers is formed as a nucleus formation layer while the other layers are formed as ordinary crystal layers so that crystal growth between the ordinary crystal layers across the nucleus formation layer is discontinuous while crystal growth of the silicon carbide in the ordinary crystal layers are continuous in a direction of thickness of the ordinary crystal layers.

In order to attain the second object described above, the present invention provides a method of producing a heat treatment jig with a silicon carbide coating for production of a semiconductor, comprising the first step of continuously growing crystal of silicon carbide on a surface of a base material by a CVD method to form an ordinary crystal layer, the second step of producing a plurality number of nuclei of silicon carbide on a surface of the ordinary crystal layer by the CVD method to form a nucleus formation layer, and the third step of continuously growing crystal of silicon carbide on a surface of the nucleus formation layer by the CVD method to form another ordinary crystal layer, the second step and the third step being repeated by an arbitrary number of times.

Further, in order to attain the second object described above, the present invention provides a method of producing a heat treatment jig with a silicon carbide coating for production of a semiconductor, comprising the first step of producing a plurality of nuclei of silicon carbide on a surface of a substrate material by a CVD method to form a nucleus formation layer, and the second step of continuously growing crystal of silicon carbide on a surface of the nucleus formation layer by the CVD method to form an ordinary crystal layer, the first step and the second step being repeated by an arbitrary number of times.

DESCRIPTION OF THE PREFERRED EMBODIMENTS

In a stage in which a silicon carbide film is formed by a CVD method, the concentration of a raw material or the pressure in a furnace is varied suitably so that new nuclei may be produced on the surface of crystal (CVD-SiC film) of silicon carbide which grows continuously. Since the growth of a film is performed again from the newly produced nuclei, linear crystal growth becomes discontinuous between ordinary crystal layers across the boundary (nucleus formation layer). The silicon carbide film in the present invention can be formed continuously by a single operation of coating by a furnace. However, the silicon carbide film need not be formed by this method, but may be formed by a plurality of coating operations.

According to the present invention, an impurity diffused from a base material is trapped by the nucleus formation layer and re-diffusion from the nucleus formation layer is performed along strokes provided by different crystal boundaries, where the film thickness is equal, the diffusion distance increases comparing with those of the prior art heat treatment jigs. In other words, the apparent impurity diffusion rate can be reduced.

First Embodiment

Figure 1:
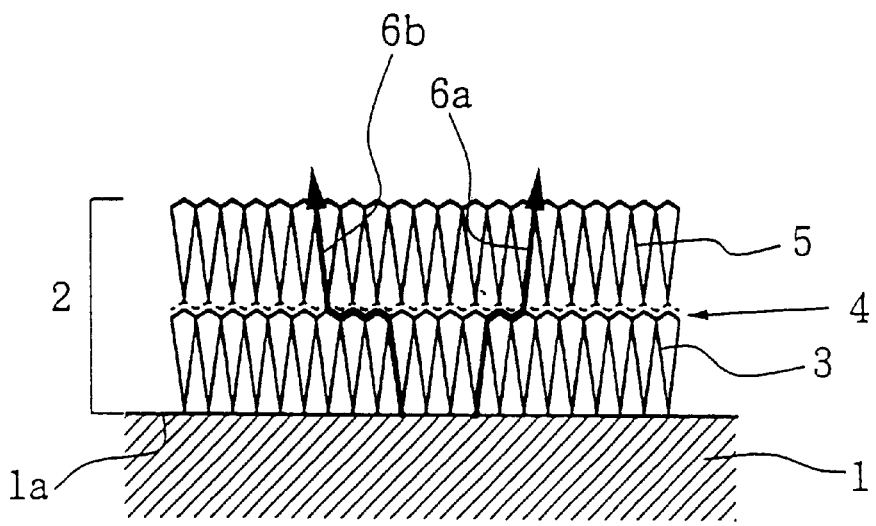
FIG. 1 is a sectional view schematically showing a heat treatment jig according to a first embodiment of the present invention.

A silicon carbide coating heat treatment jig (hereinafter referred to merely as heat treatment jig) for production of a semiconductor according to a first embodiment of the present invention will be described with reference to FIG. 1. FIG. 1 is a schematic view showing part of a section of the heat treatment jig taken in a direction of the thickness.

The heat treatment jig includes a base material 1, and a silicon carbide film 2 formed on the surface 1a of the base material 1. The silicon carbide film 2 is formed from a plurality of layers 3 to 5 parallel to the surface 1a of the base material 1. At least one of the layers 3 to 5, for example, the layer 4 is formed as a nuclei formation layer, and the other layers are formed as ordinary crystal layers. Thus, linear crystal growth between the ordinary crystal layers 3 and 5 between which the nucleus formation layer 4 is positioned is made discontinuous while crystal growth of silicon carbide in the ordinary crystal layers 3 and 5 is continuous in the direction of the thickness.

The base material 1 may be made of a material similar to that of the conventional heat treatment jigs. Preferably, a material having a conformity in CTE with the silicon carbide film 2 such as carbon (including graphite), reaction sintered SiC or self sintered SiC is used. CTE denotes a coefficient of thermal expansion. Reaction sintered SiC is obtained by impregnating SiC (silicon carbide) with Si (silicon). Self sintered SiC is obtained by adding a sintering assistant such as B (boron) or C (carbon) to SiC and baking the SiC.

The silicon carbide film 2 (CVD-SiC film) is formed from a plurality of ordinary crystal layers and at least one nucleus formation layer. The first ordinary crystal layer 3, the nucleus formation layer 4 and the second ordinary crystal layer 5 are formed in this order on the surface 1a of the base material 1, and an arbitrary number of nucleus formation layers (not shown) and ordinary crystal layers (not shown) are additionally formed alternately on them.

Crystal growth of silicon carbide in each of the ordinary crystal layers is continuous linearly or radially in the direction of the thickness.

The base material 1 contains a considerable amount of an impurity even if purification processing is performed, and this impurity diffuses from the base material 1 into an adjacent portion of the heat treatment jig through the silicon carbide film 2. This diffusion process is schematically illustrated in allow marks 6a and 6b in FIG. 1. The impurity diffusing from the base material 1 is trapped, during the diffusion process thereof, at the location of the nucleus formation layer 4, and subsequent diffusion from the nucleus formation layer 4 passes along strokes provided by crystal boundaries of the second ordinary crystal layer 5. Consequently, where the film thickness is equal the diffusion distance is increased comparing with those in the prior art heat treatment jigs. In other words, the apparent impurity diffusion rate can be reduced.

Further, since a multiple layer structure is formed continuously without mechanically grinding a substrate layer different from the prior art heat treatment jigs, the adhesion of the individual layers of the multiple layer silicon carbide film is very high.

Consequently, diffusion of the impurity from the heat treatment jig into a wafer can be retarded, and the life of the heat treatment jig can be augmented.

Figure 2:
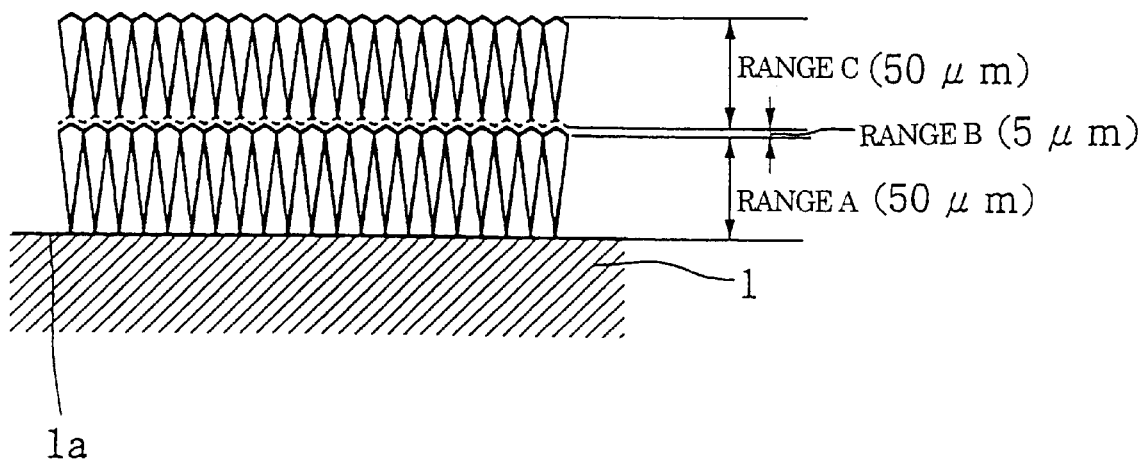
FIG. 2 is a sectional view illustrating a method of producing the heat treatment jig shown in FIG. 1.

Subsequently, a method of producing the heat treatment jig will be described with reference to FIG. 2. FIG. 2 is a schematic view showing part of a section of the silicon carbide film 2 after formed taken in a direction of the thickness.

The method of producing the heat treatment jig includes the first step of continuously growing crystal of silicon carbide on the surface of a base material by a CVD method to form an ordinary crystal layer, the second step of producing a large number of nuclei of silicon carbide on the surface of the ordinary crystal layer by the CVD method to form a nucleus formation layer, and the third step of continuously growing crystal of silicon carbide on the surface of the nucleus formation layer by the CVD method to form another ordinary crystal layer, the second step and the third step being repeated by an arbitrary number of times.

Subsequently, the first step will be described in detail.

Maintaining conditions for crystal growth for 120 minutes using a CVD furnace, the first ordinary crystal layer 3 of 50 $\mu$m thick is formed by the CVD method. For the CVD furnace, a conventional CVD furnace can be used.

The first ordinary crystal layer 3 is a usual layer of continuously grown crystal, and forms a layer within a range A of 50 $\mu$m from the surface 1a of the base material 1 in the silicon carbide film 2 after formed.

The conditions for crystal growth mentioned above will be described. The flow rate of silicon tetrachloride ($SiCl_4$, tetrachlorosilane) gas is 0.5 SLM, the flow rate of methane ($CH_4$) gas is 0.25 SLM, the flow rate of hydrogen ($H_2$) gas is 2.00 SLM, the heat treatment temperature is 1,400° C., and the furnace pressure is 20 torr (hereinafter referred to as predetermined pressure). The $SiCl_4$, $CH_4$ and $H_2$ gases are raw material gases. In the following description, the flow rates of the raw material gases in those conditions will be hereinafter referred to as predetermined flow rates.

The conditions for crystal growth are not limited to those given above, and any conditions may be employed only if crystal can be grown continuously, and conditions of a conventional CVD method can be adopted.

Subsequently, the second step will be described in detail.

As a method of forming the nucleus formation layer 4, the flow rates of the raw material gases ($SiCl_4$ gas and $CH_4$ gas) except the $H_2$ gas are continuously reduced to one fourth or less the predetermined flow rates (conditions for crystal growth) in one batch as in the first step. Preferably, the furnace pressure is reduced to $\frac{1}{10}$ or less the predetermined pressure (condition for crystal growth) within the 10 minutes. This state is held for approximately 30 minutes to form the nucleus formation layer 4 of 5 $\mu$m thick. The nucleus formation layer 4 is formed as a layer within a range B of 5 $\mu$m from the surface of the ordinary crystal layer 3 in the silicon carbide film 2 after formed.

It has been confirmed that, even if the flow rates of the raw material gases upon formation of a nucleus formation layer are reduced but within $\frac{1}{3}$ which is larger than $\frac{1}{4}$ of the raw material gas flow rates upon formation of an ordinary crystal layer, a nucleus formation layer which is composed of an aggregate of crystal grains of a particle size equal to or smaller than 1 $\mu$m is not formed.

Conditions for production of nuclei are similar to the conditions for crystal growth except the flow rates of the raw material gases or the furnace pressure. The conditions for production of nuclei are not limited to them, and any conditions may be used only if a nucleus formation layer is formed.

Subsequently, the third step will be described in detail.

Changing the applied conditions from the conditions for production of nuclei to the conditions for crystal growth, the ordinary crystal layer 5 is formed continuously to the second step. In particular, the flow rates of the raw material gases ($SiCl_4$ gas and $CH_4$ gas) are continuously increased to the predetermined flow rates within 10 minutes. Or, the furnace pressure is increased to the predetermined pressure. Thereafter, the conditions for crystal growth are maintained for 120 seconds to continuously grow crystal of silicon carbide again to form the ordinary crystal layer 5 of 50 $\mu$m thick. The ordinary crystal layer 5 is a film of crystal continuously grown in a layer, and forms a layer within a range C of 50 $\mu$m from the surface of the nucleus formation layer 4 in the silicon carbide film 2 after formed.

By repeating the second step and the third step by an arbitrary number of times, the arbitrary number of nucleus formation layers and ordinary crystal layers can be formed alternately. Where a plurality of nucleus formation layers are formed, the diffusion stroke of an impurity increases in accordance with the number. Consequently, there is an effect that diffusion of an impurity is retarded by an increasing time.

It is to be noted that, while the SiC film and the method of producing the same wherein an ordinary crystal layer is formed first in the first step and then a nucleus formation layer is formed in the second step, whereafter those steps are successively repeated alternately are described above, the steps may be reversed. In particular, the SiC film and the method of producing the same maybe modified such that a nucleus formation layer is formed first in the first step and then an ordinary crystal layer is formed in the second step, whereafter those steps are successively repeated alternately. For example, a method of producing a silicon carbide coated heat treatment jig for production of a semiconductor may be characterized in that it comprises the first step of producing a large number of nuclei of silicon carbide on the surface of a substrate material by a CVD method to form a nucleus formation layer, and the second step of continuously growing crystal of silicon carbide on the surface of the nucleus formation layer by the CVD method to form an ordinary crystal layer, the first step and the second step being repeated by an arbitrary number of times.

The present invention is not limited to the production methods described above. For example, the first to third steps may not be performed within a single batch, but the second step and the third step may be performed in another batch after the ordinary crystal layer 3 is formed in the first step. Also in this instance, similar effects to those described hereinabove can be achieved.

Subsequently, the nucleus formation layer will be described in more detail

As described hereinabove, the nucleus formation layer 4 is formed in the range B between the ranges A and C, and linear crystal growth of silicon carbide is discontinuous across the range B.

Preferably, the thickness of the nucleus formation layer is 1 $\mu$m to 30 $\mu$m. For example, where the thickness of the nucleus formation layer 4 is less than 1 $\mu$m, formation of nuclei is insufficient, and crystal continuously grows linearly partially between the first ordinary crystal layer 3 and second the ordinary crystal layer 5. Therefore, there is a problem that diffusion of an impurity likely proceeds rapidly. On the other hand, where the thickness of the nucleus formation layer exceeds 30 $\mu$m, since the film formation rate of the nucleus formation layer is extremely slow comparing with the film formation rate based on the conditions of crystal growth, the efficiency in formation of the silicon carbide film 2 likely becomes deteriorated. Therefore, there is a problem that the production cost is liable to increase. Further, the nucleus formation layer likely suffers from concentration of stress due to the structure thereof comparing with an ordinary crystal layer, and has a problem that, if the thickness given above is exceeded, exfoliation of an ordinary crystal layer or production of a crack in a nucleus formation layer likely occurs.

If the first embodiment described above (example wherein an ordinary crystal layer is formed on the surface of a base material) and the reverse example (example wherein a nucleus formation layer is formed on the surface of a base material) are compared with each other, the former is more advantageous in regard to the length of the reaction time, but the latter is more advantageous in regard to adhesion between a silicon carbide film and a base material. It is considered that the reason is that a nucleus formation layer is composed of an aggregate of β-SiC crystal of a grain size equal to or less than 1 μm and consequently contacts at many points with a base material.

Whether crystal growth is continuous or discontinuous or whether a nucleus formation layer is present or absent can be confirmed readily by analyzing a COMPO image or a result of oxidation in section.

Second to Fourth Embodiments and First Prior Art

Subsequently, heat treatment jigs according to second to fourth embodiments of the present invention and the heat treatment jig according to the first prior art will be described.

Those heat treatment jigs include a silicon carbide film (CVD-SiC film) of 100 μm thick formed on the surface of a base material of carbon (containing iron (Fe) by approximately 200 ppm. The dimensions are 10×10×50 mm). However, the construction of the silicon carbide film is different among them as successively described hereinbelow. The other constructions of the second to fourth embodiments are similar to that of the first embodiment described above.

The silicon carbide film in the second embodiment includes an ordinary crystal layer of 45 μm thick, a nucleus formation layer of 10 μm thick, and another ordinary crystal layer of 45 μm thick formed in this order in a single batch.

The silicon carbide film of the third embodiment includes an ordinary crystal layer of 30 μm thick, a nucleus formation layer of 10 μm thick, another ordinary crystal layer of 20 μm thick, another nucleus formation layer of 10 μm thick and a further ordinary crystal layer of 30 μm thick in this order in a single batch.

The silicon carbide film in the fourth embodiment includes an ordinary crystal layer of 45 μm thick, a nucleus formation layer of 10 μm thick and another ordinary crystal layer of 45 μm thick formed in this order in separate batches from one another.

The silicon carbide film of the first prior art is formed by forming an ordinary crystal layer of 100 μm thick in a similar manner as in the prior art.

Subsequently, impurity diffusion rates of the heat treatment jigs of the second to fourth embodiments and the first prior art are compared with each other.

The impurity diffusion rates were measured in the following manner.

Figure 3:
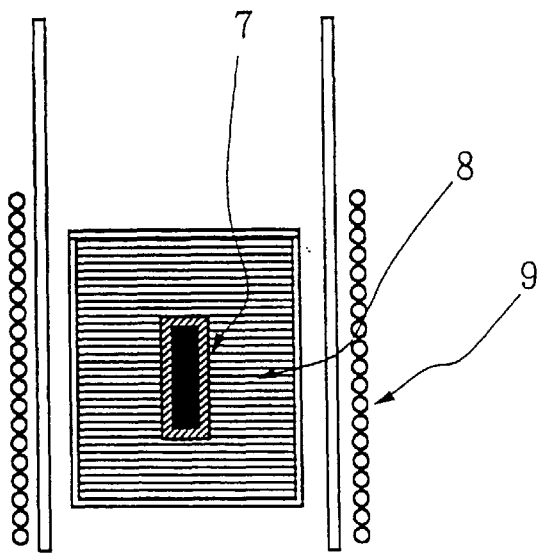
FIG. 3 is a schematic view illustrating a method of measuring an impurity diffusion rate.

As shown in FIG. 3, first a heat treatment jig 7 was inserted into quartz powder 8 and heat treated for 1,000 hours (Hrs) at a temperature of 1,350° C. by means of a heater 9 in an argon (Ar) ambient atmosphere. Thereafter, the heat treatment jig 7 was taken out and the concentration of iron in the quartz powder 8 was measured. The concentration of iron was measured in a similar manner for the cases where heat treatment was performed for 2,000 hours and for 3,000 hours.

Figure 4:
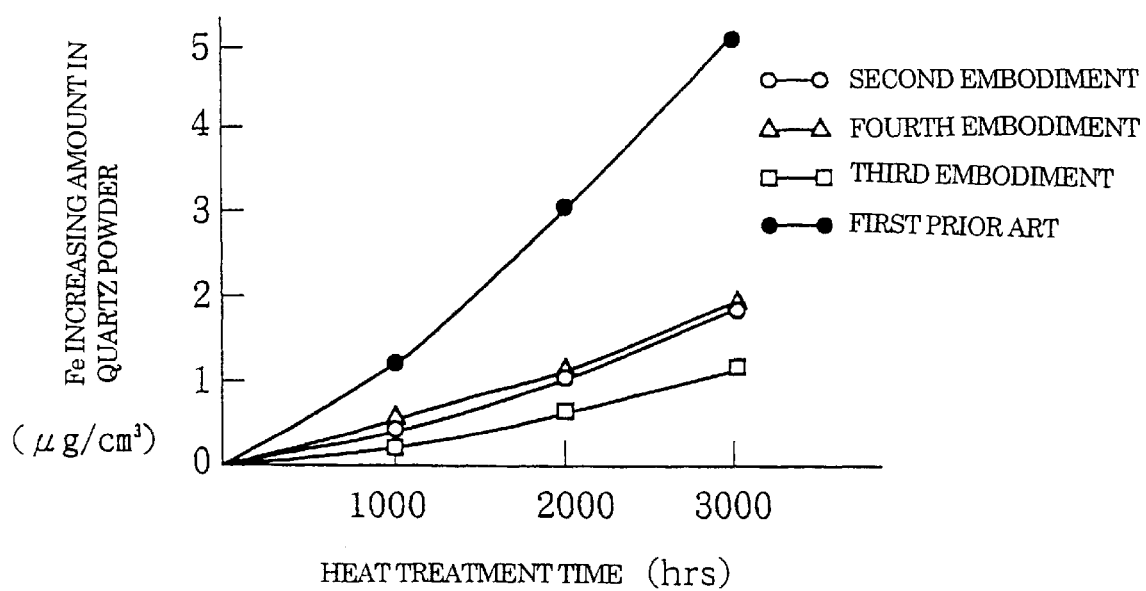
FIG. 4 is a graph illustrating impurity diffusion rates of second to fourth embodiments of the present invention and the first prior art.

The increasing amount of Fe in the quartz powder was calculated from the measured concentration of iron, that is, (measured value)—(blank value) ($\mu$g/cm$^3$) was calculated. The increasing amounts of Fe obtained in this manner are illustrated in FIG. 4. The blank value is an initial concentration. It is to be noted that, in FIG. 4, the Fe increasing amounts in the second to fourth embodiments and the first prior art are indicated by the marks ○, □, △ and ●, respectively. The rate of the Fe increasing amount in the quartz powder to the heat treatment time is the impurity diffusion rate.

As can be seen apparently from the graph of FIG. 4, the second to fourth embodiments exhibit lower impurity diffusion rates than the first prior art. In this manner, the heat treatment jigs according to the second to fourth embodiments have an effect that the impurity diffusion from a base material into an adjacent portion of the heat treatment jig is retarded. Particularly the third embodiment exhibits a low diffusion rate since it has two nucleus formation layers.

As described above, the base material is not limited to carbon, but some other materials may be used. For example, also where reaction sintered SiC (silicon carbide) or self sintered SiC is used as the base material similar effects to those of the second to fourth embodiments are achieved.

Subsequently, the composition of the multiple layer film was investigated by an XRD (X-ray diffraction) analysis. The result indicates that, with each of the heat treatment jigs, the composition of the silicon carbide film was silicon carbide (β-SiC).

Then, the heat treatment jigs of the second to fourth embodiments (which have nucleus formation layers) were line analyzed by an EPMA (election probe micro analysis), and particularly, a portion of each heat treatment jig in the proximity of a boundary between films, that is, a portion in which ordinary crystal nucleus formation layer and ordinary crystal are formed in order, was line analyzed. The result indicates that, components detected were only silicon (Si) and carbon (C), and no variation in count number was observed and no variation in composition was detected in the nucleus formation layer and portions in the proximity of the same with any of the heat treatment jigs.

Further, although crystal grain on the order of sub micron was not confirmed from the accuracy of the apparatus and the adjustment accuracy of the samples, it was confirmed at least that the nucleus formation layers were formed from aggregates of crystal grain having grain sizes of 1 μm or less.

Figure 5:
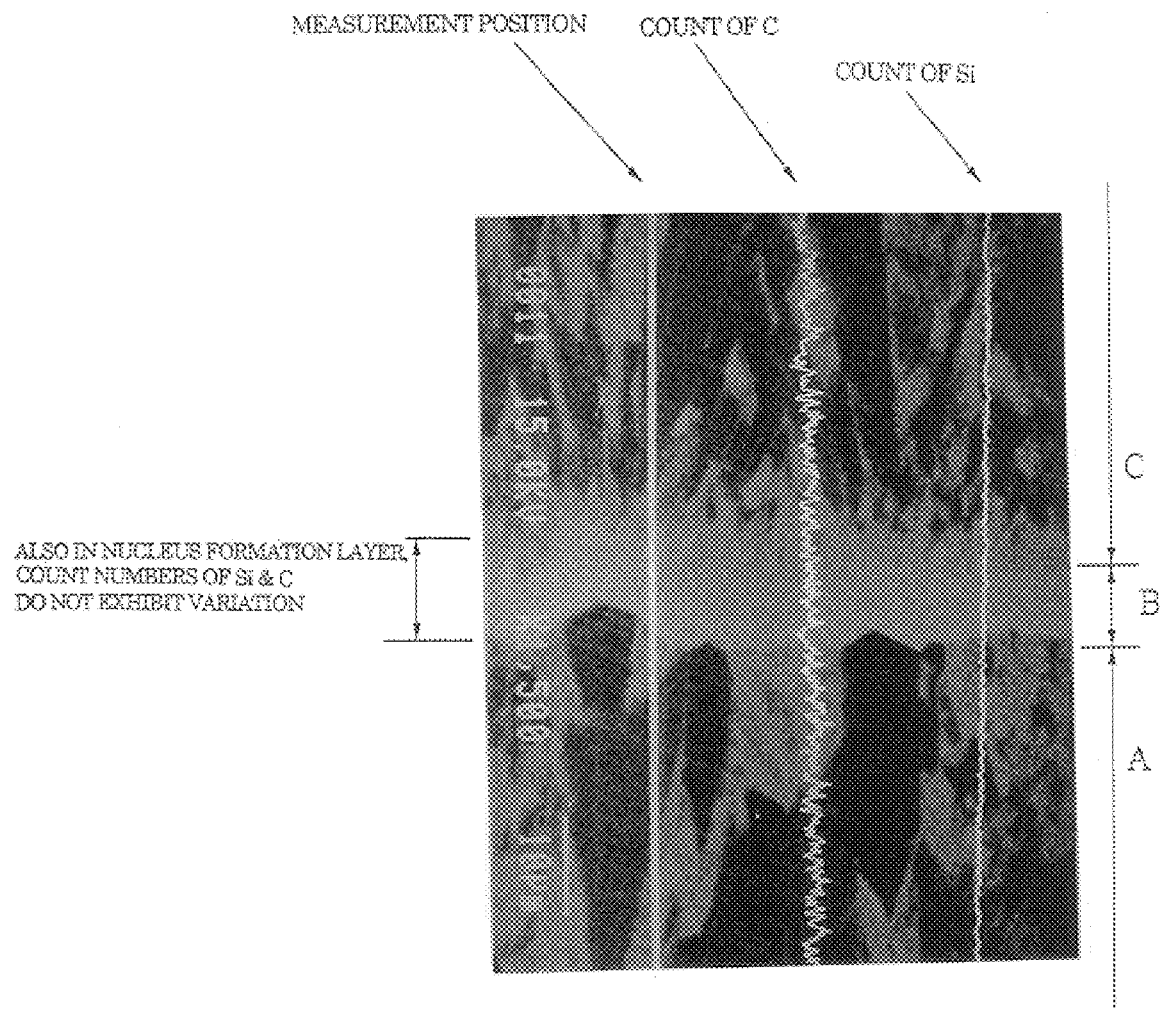
FIG. 5 is a photograph of a structure of a ceramic material by an EPMA showing the heat treatment jig of the first embodiment in a magnification of 1,500 times.
Figure 6:
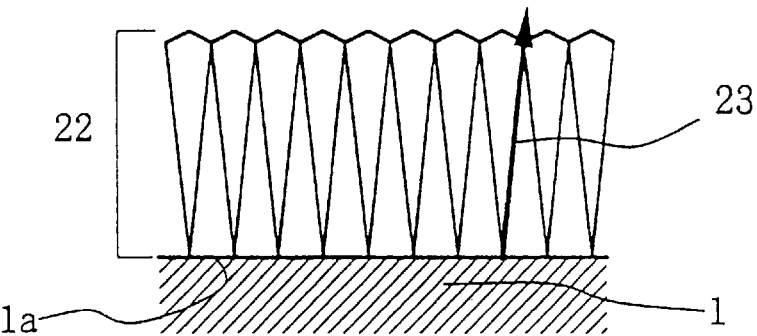
FIG. 6 is a sectional view schematically showing a jig of the first prior art.
Figure 7:
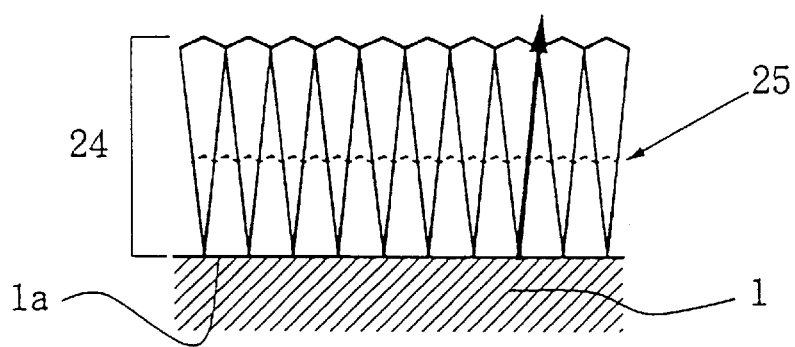
FIG. 7 is a sectional view schematically showing a jig of the second prior art.
Figure 8:
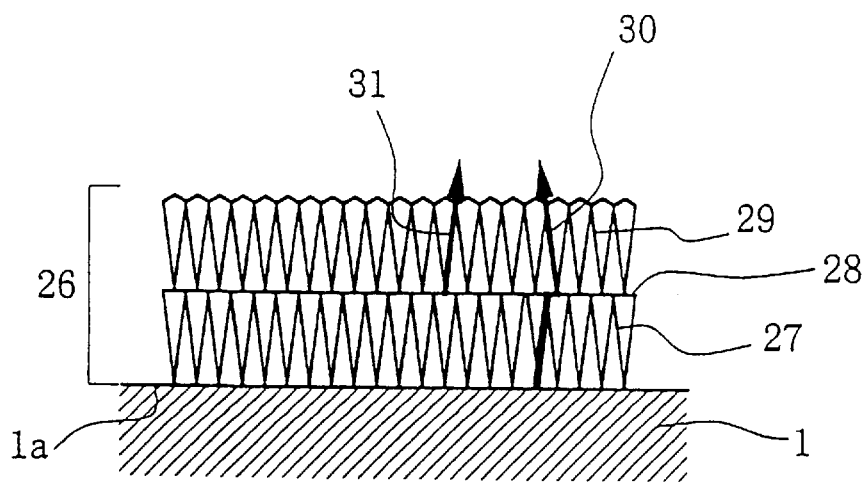
FIG. 8 is a sectional view schematically showing a jig of the third prior art.

FIG. 5 shows a photograph of the structure of a ceramic material by an EPMA. The structure photograph of FIG. 5 shows the heat treatment jig of the embodiment in a magnification scale of 1,500 times. In FIG. 5, a measurement position of the line analysis by the EPMA is indicated in a corresponding relationship to the structure photograph, and the count number of Si and the count number of C are indicated in a corresponding relationship to the measurement position by graphs. As apparently seen from FIG. 5, the count numbers of Si and C exhibit little variation also in the nucleus formation layer.

Fifth Embodiment

Multiple layer coating processing was performed for a rejected product with a film such as a product of a complicated shape such as, for example, a vertical boat by means of a jig CVD furnace in a similar manner as in the second to fourth embodiments. The result indicates that there was no problem in regard to going round of gas along a surface of a product of a complicated shape such as a vertical boat. Similarly to the second to fourth embodiments, a nucleus formation layer parallel to a base member was confined in a silicon carbide film, and no variation in composition was found in the nucleus formation layer or in portions around the same.

According to the present invention, since at least one layer is formed as a nucleus formation layer to make linear crystal growth of silicon carbide across the nucleus formation layer discontinuous, an impurity can be trapped by the nucleus formation layer thereby to retard diffusion of the impurity and the adhesion between layers of a silicon carbide film can be augmented.

Further, according to the present invention, when to form a multiple layer silicon carbide film, the multiple layers can be formed continuously without performing intervening mechanical polishing, and a nucleus formation layer can be formed readily not only in a simple shape but also in a complicated shape.

What is claimed is:

1. A heat treatment jig with a silicon carbide coating for production of a semiconductor which includes a base material and a silicon carbide film formed on a surface of said base material by a CVD method, wherein said silicon carbide film is formed from a plurality of layers substantially parallel to the surface of said base material and at least one of said layers is formed as a nucleus formation layer while the other layers are formed as ordinary crystal layers so that crystal growth between said ordinary crystal layers across said nucleus formation layer is discontinuous while crystal growth of the silicon carbide in said ordinary crystal layers are continuous in a direction of thickness of said ordinary crystal layers.

2. A heat treatment jig as claimed in claim 1, wherein ordinary crystal layers and a nucleus formation layer or layers are formed alternately on the surface of said base material.

3. A heat treatment jig as claimed in claim 1, wherein said nucleus formation layer has a thickness ranging from 1 μm to 30 μm.

4. A heat treatment jig as claimed in claim 2, wherein said nucleus formation layer has a thickness ranging from 1 μm to 30 μm.

5. A heat treatment jig as claimed in claim 1, wherein said nucleus formation layer is formed from an aggregate of β-SiC crystal of a grain size of 1 μm or less.

6. A heat treatment jig as claimed in claim 2, wherein said nucleus formation layer is formed from an aggregate of β-SiC crystal of a grain size of 1 μm or less.

7. A method of producing a heat treatment jig with a silicon carbide coating for production of a semiconductor, comprising the first step of continuously growing crystal of silicon carbide on a surface of a base material by a CVD method to form an ordinary crystal layer, the second step of producing a plurality number of nuclei of silicon carbide on a surface of the ordinary crystal layer by the CVD method to form a nucleus formation layer, and the third step of continuously growing crystal of silicon carbide on a surface of the nucleus formation layer by the CVD method to form another ordinary crystal layer, the second step and the third step being repeated by an arbitrary number of times.

8. A method of producing a silicon carbide coated heat treatment jig as claimed in claim 7, wherein a flow rate of a raw material gas is set to a predetermined flow rate to perform the first step, and the flow rate of the law material gas is reduced to one fourth or less the predetermined flow rate to perform the second step continuously to the first step, whereafter the flow rate of the raw material gas is increased to the predetermined flow rate to perform the third step continuously to the second step.

9. A method of producing a heat treatment jig with a silicon carbide coating for the production of a semiconductor, complying the first step of producing a plurality of nuclei of silicon carbide on a surface of a substrate material by a CVD method to form a nucleus formation layer, and the second step of continuously growing crystal of silicon carbide on a surface of the nucleus formation layer by the CVD method to form an ordinaiy crystal layer, the first step and the second step being repeated by an arbitrary number of times.

* * * * *